United States Patent [19]

Vervoort

[11] Patent Number: 5,640,759

[45] Date of Patent: Jun. 24, 1997

[54] METHOD OF CONNECTING TWO STRIPS PROVIDED WITH CONDUCTOR PATTERNS

[75] Inventor: Martinus A. F. Vervoort, Eindhoven, Netherlands

[73] Assignee: U.S. Philips Corporation, New York, N.Y.

[21] Appl. No.: 420,252

[22] Filed: Apr. 7, 1995

[30] Foreign Application Priority Data

Apr. 22, 1994 [BE] Belgium ................. 09400416

[51] Int. Cl.$^6$ .................. H05K 3/36; H05K 3/34; H01R 43/00
[52] U.S. Cl. .................. 29/830; 29/840; 29/872; 228/175; 228/180.1; 360/104
[58] Field of Search .................. 29/872, 873, 830, 29/840; 228/175, 180.1

[56] References Cited

U.S. PATENT DOCUMENTS

| 3,646,670 | 3/1972 | Maeda ................. 29/627 |
| 3,772,276 | 11/1973 | Weisenburger ................. 29/830 |
| 4,157,932 | 6/1979 | Hirata ................. 29/830 |

FOREIGN PATENT DOCUMENTS

| 09400097 | 7/1994 | Belgium . |
| 9104123 | 4/1991 | WIPO ................. 228/175 |

*Primary Examiner*—P. W. Echols
*Attorney, Agent, or Firm*—John C. Fox

[57] ABSTRACT

A method of connecting two strips (1, 3) each provided with a conductor pattern, an insulating coating (9, 11) and a set of free conductor portions (5a, 7a) of the conductor pattern, which free conductor portions are disposed outside the coating. The strips are positioned in such a manner relative to one another that the one set of free conductor portions faces the other set of free conductor portions and the coatings overlap one another at least partly. After this, the two strips are pressed against one another and the one set of free conductor portions is soldered to the other set of free conductor portions. However, before the strips are pressed against one another an adhesive is applied to at least one of the coatings at such a location that after positioning of the strips the adhesive is situated in an overlapping area between the coatings. The adhesive is used for adhering the coatings to one another while the strips are pressed against one another and the one set of free conductor portions is soldered to the other set of free conductor portions.

4 Claims, 2 Drawing Sheets

5,640,759

METHOD OF CONNECTING TWO STRIPS PROVIDED WITH CONDUCTOR PATTERNS

BACKGROUND OF THE INVENTION

A method is known for connecting two strips each provided with a conductor pattern, an insulating coating, which covers a part of the conductor pattern, and a set of free conductor portions of the conductor pattern, which free conductor portions are disposed outside the coating, the strips being positioned in such a manner relative to one another that the one set of free conductor portions faces the other set of free conductor portions and the coatings overlap one another at least partly, after which the two strips are pressed against one another and the one set of free conductor portions is soldered in the other set of free conductor portions.

Such a method used inter alia to interconnect two flexible foils provided with printed wiring. The free end portions of the wiring are interconnected by soldering in order to obtain the desired electrical connections. For a sufficiently strong mechanical connection between the foils an excess amount of solder is required. However, this is virtually impossible in the case of very fine wiring, particularly in the case of a very small pitch. Therefore, the resulting mechanical connection is sometimes strengthened by applying an adhesive between the foils after soldering. However, this is time-consuming and difficult to realise.

SUMMARY OF THE INVENTION

It is an object of the invention to improve a method of the type defined in the opening paragraph so as to obtain a reliable mechanical connection in a simple and time-saving manner.

To this end the invention is characterised in that before the strips are pressed against one another an adhesive is applied to at least one of the coatings covering a part of one of the conductor patterns, at such a location that after positioning of the strips the adhesive is situated in an overlapping area between the coatings, which adhesive is used for adhering the coatings to one another at least while the strips are pressed against one another and the one set of free conductor portions is soldered to the other set of free conductor portions. Generally, the free conductor portions will be free conductor ends.

The adhesive bonds formed between the insulating coating during soldering prevents mutual displacements of the strips at the location of the inherently vulnerable soldered joints. As a result, the soldered joints thus formed are already protected effectively against breakage immediately after they have been formed, which results in a substantially higher production yield than attainable with the known method. The method in accordance with the invention, which can be carried out by customary means which are known per se, is very suitable for electrically and mechanically interconnecting connection foils of magnetic heads, particularly multi-track magnetic heads. These foils generally have conductor patterns with very narrow conductors and very small distances between the conductors, for example distances of the order or magnitude of 100-300 microns.

It is to be noted that U.S. Pat. No. 3,646,670 discloses a method of connecting conductors which uses adhesive layers. Large numbers of these conductors are situated on insulating boards, the conductors being affixed to the boards by means of the adhesive layers. Conductors of two boards are connected to one another by heating solder layers.

An embodiment of the method in accordance with the invention is characterised in that during positioning of the strips the adhesive is in a solid condition, heat being applied to the adhesive present between the coatings to soften the adhesive at least while the one set of free conductor portions is soldered to the other set of free conductor portions. The adhesive is then preferably a heat-softening adhesive. An advantage of this is that the adhesive can already be applied to one or both strips at an earlier stage, so that the adhesive can be in a solid or at least substantially solid condition during handling of the strips, for example when they are positioned relative to one another. By supplying heat, for example by means of a heat-supplying pressure element present on at least one side of the facing strips or by means of heat-supplying pressure elements present on both sides of the facing strips, the adhesive is brought into a softened, more or less liquid condition. A suitable adhesive is, for example, a hot melt, for example on a polyamide basis. Such a thermoplastic adhesive can be re-softened, even after a longer time. Another suitable adhesive is, for example, a reactive prepolymer, which is moisture-curing.

An embodiment of the method in accordance with the invention is characterised in that after the one set of free conductor portions has been soldered to the other set of free conductor portions additional heat is supplied to the adhesive while simultaneously pressure is applied at the location of the adhesive. In this way an additional strengthening of the adhesive bond already formed between the coatings is possible. Said additional supply of heat is possible by means of a plurality of heat-supplying pressure elements arranged at one or both sides of the joined strips.

The invention further relates to a magnetic head, particularly a multi-track magnetic head, provided with two strips interconnected in accordance with the method of the invention.

BRIEF DESCRIPTION OF THE DRAWING

The invention will now be described in more detail, by way of example, with reference to the drawings, in which.

DESCRIPTION OF THE PREFERRED EMBODIMENTS

Figure 1:
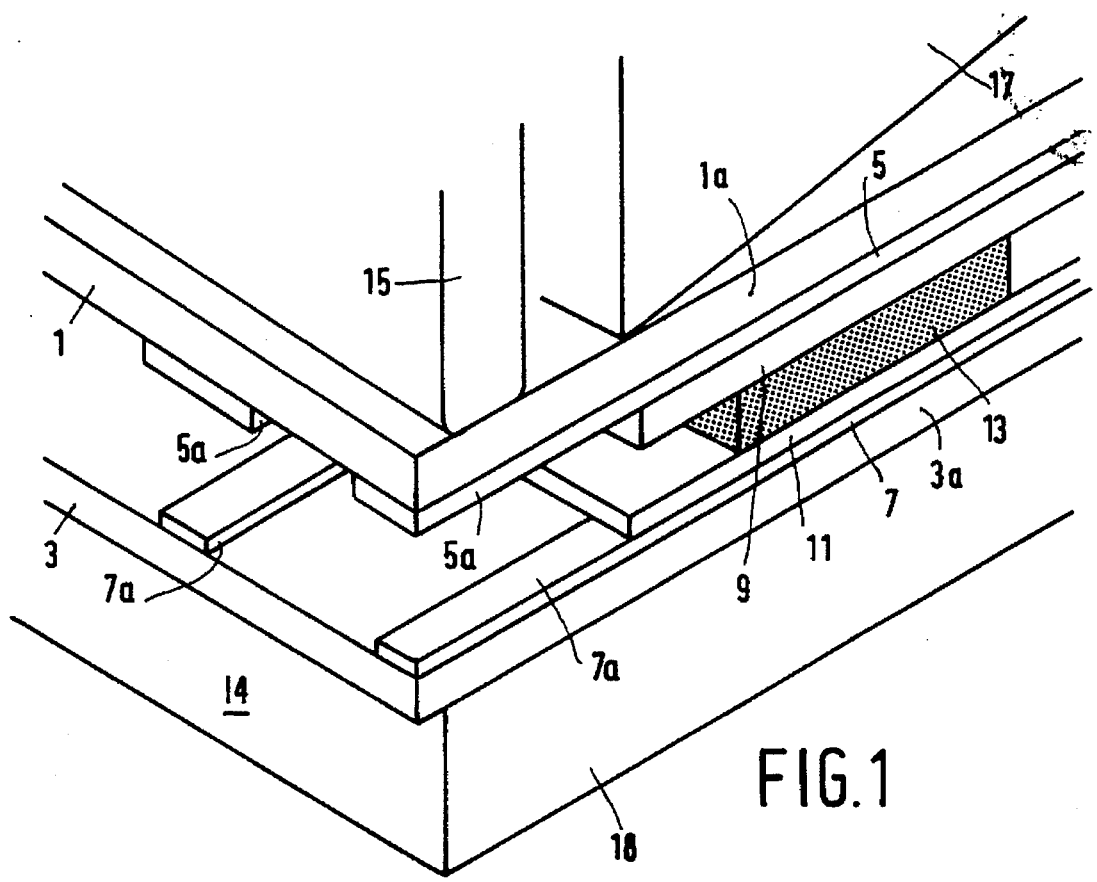
FIG. 1 illustrates diagrammatically and in perspective one phase of an embodiment of the method in accordance with the invention.

FIG. 1 shows two strips 1 and 3, each provided with a printed conductor pattern comprising conductors 5 and 7, respectively. The strips 1 and 3, which in the present example each comprise a flexible base 1a and 3a, respectively, further have a protective coating 9 and 11, respectively, the conductor pattern extending between the base 1a and the coating 9 and between the base 3a and the coating 11, respectively. The coating 9 is formed by, for example, a polyimide layer; the coating 11 in the present example is a lacquer layer or a resist. The conductors 5 and 7 of the conductor patterns terminate in non-coated free conductor portions or conductor ends 5a and 7a, respectively. According to the inventive method an amount of adhesive 13, for example a hot melt, is provided on at least one of the coatings 9 and 11, in the present example a portion of the coating 9 adjoining the set of free conductor portions 5a and consequently not in contact with the conductor pattern. The adhesive used here is applied at a temperature above the softening temperature, which lies approximately between 110° and 200° C. After application the adhesive cures by cooling.

For electrically and mechanically connecting the strip 1 provided with the adhesive 13 to the strip 3, both strips 1 and 3 are positioned in such a manner relative to one another that the set of free conductor portions 5a is disposed opposite the set of free conductor portions 7a and the portions of the coatings 9 and 11 which adjoin the free conductor portions overlap one another, the adhesive 13 extending in an overlapping area between the coatings. In the present example, one of the strips, i.e. the strip 3, is disposed on a supporting surface 14.

Figure 2:
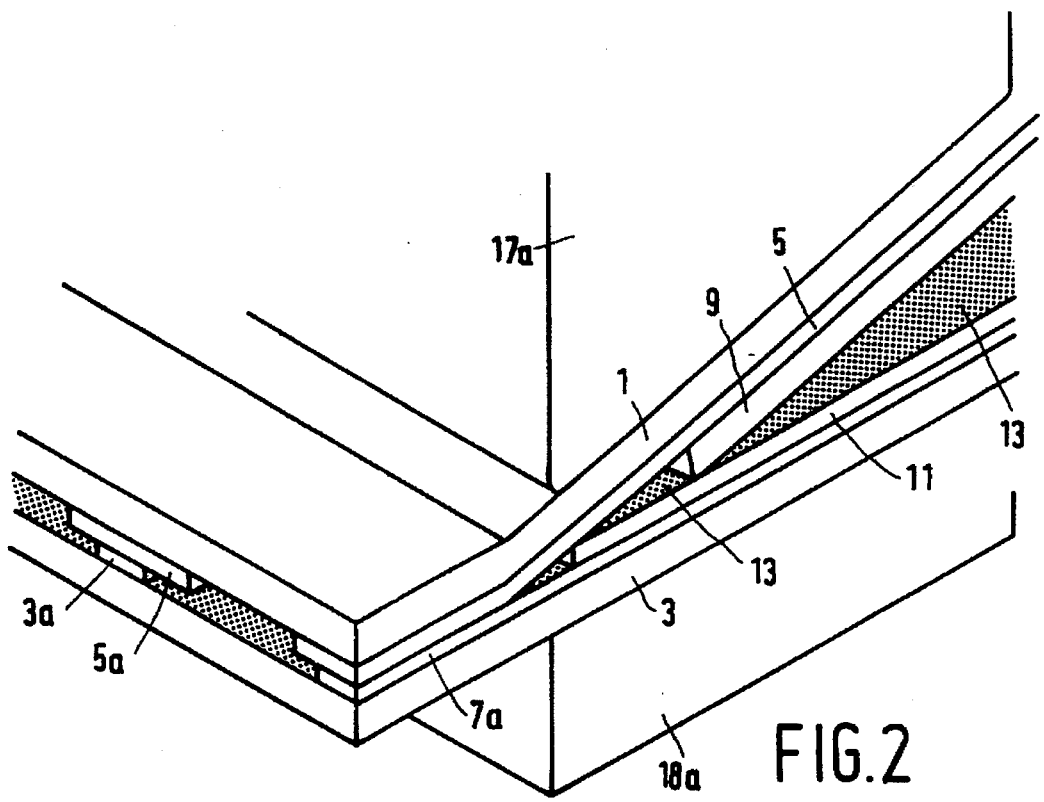
FIG. 2 illustrates diagrammatically and in perspective a further phase of the embodiment of the method in accordance with the invention.

According to the inventive method, as is shown in FIG. 2, the strips 1 and 3, after they have been positioned, are pressed against one another, at least near the free conductor portions 5a and 7a, the conductor portions 5a being pressed against the conductor portions 7a, and heat is applied, at least at the location of the conductor portions 5a and 7a, to solder the set of free conductor portions 5a to the set of free conductor portions 7a and to heat the adhesive 13 between the coatings 9 and 11 to a temperature above the softening temperature. The application of pressure to the strips 1 and 3 and the supply of heat is effected by suitable means, which comprise for example a heat-supplying pressure element 15 and a heat-supplying pressure element 17. If desired, a further heat-supplying element 18 may be used. It is to be noted that for the soldering process the free conductor portions 5a and/or 7a may be pre-tinned with a solder material, such as lead-tin or gold-tin.

After the conductor portions 5a have been connected to the conductor portions 7a the supply of heat is stopped and the adhesive 13 which has spread between and adhered to the coatings 7 and 9 is allowed to cool and cure. If desired, a subsequent thermal treatment may be applied to improve the resulting adhesive bond. For this purpose heat is applied again, the heat now being directed to the adhesive so as to avoid thermal loading of the soldered joints, for example via a heat-supplying pressure element 17a and/or a further heat-supplying element 18a. After cooling a firm mechanical bond between the strips 1 and 3 is guaranteed. Obviously, the area over which the softened adhesive spreads depends on the amount applied.

Figure 3:
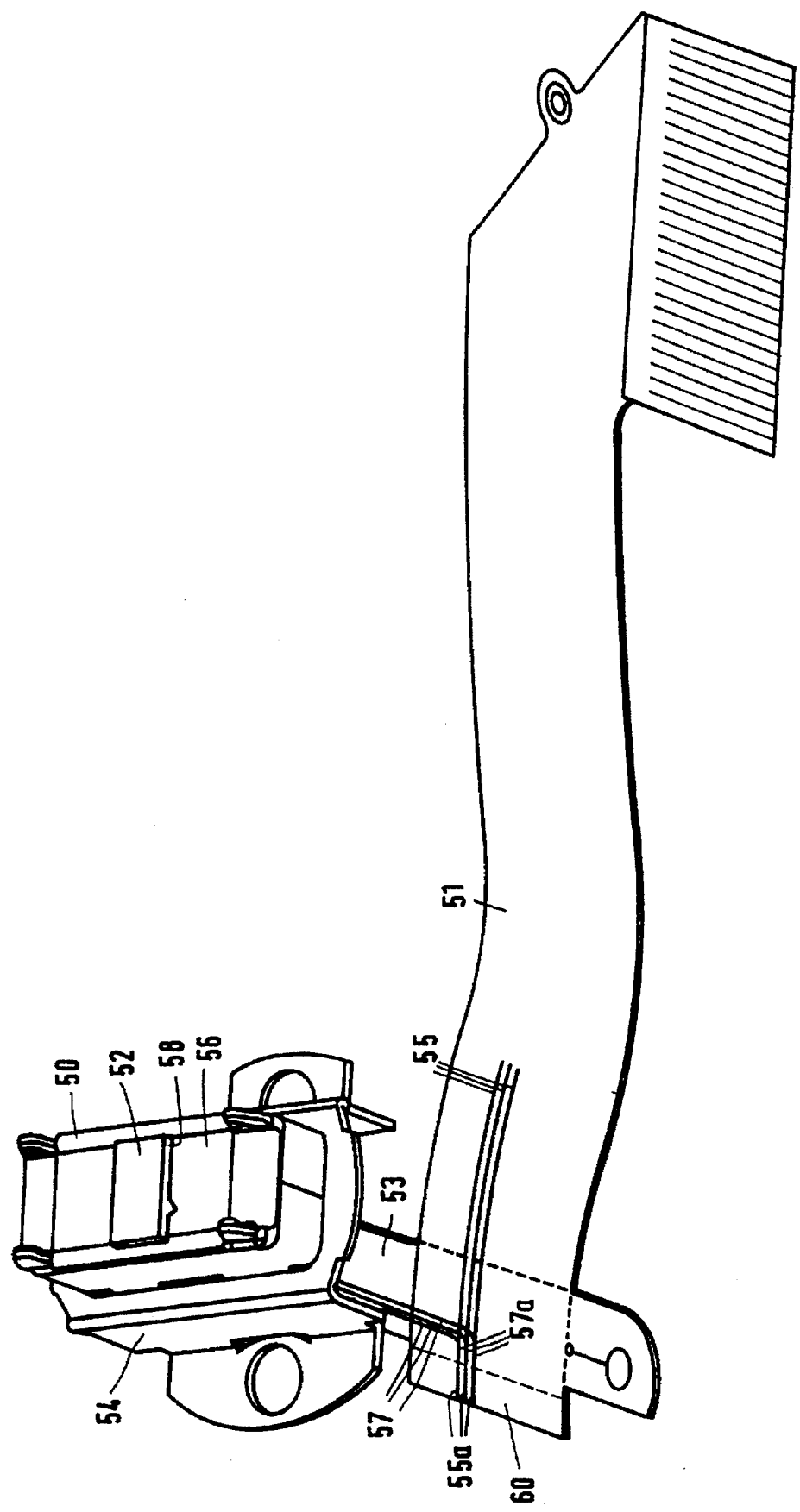
FIG. 3 shows diagrammatically a magnetic head provided with two strips interconnected in accordance with the method of the invention.

The magnetic-head unit shown in FIG. 3 comprises a housing 50, a thin-film magnetic head 52 mounted in the housing 50, and a support 54 for the housing 50. A magnetic head has at least one transducing element for example a magneto-resistant element or an inductive element, and at least one transducing gap terminating in a head face. In the present example the magnetic head 52 has a plurality of transducing elements and a plurality of, for example 18, transducing gaps terminating in the head face 56. Such a magnetic head is described in Belgian Patent Application no. 09400097 herewith incorporated by reference). The magnetic head in accordance with the invention further comprises electrical input and output means in the form of two strips 51 and 53 interconnected in accordance with the inventive method, which strips are electrically connected with the transducing element or elements. These strips, which correspond to the strips 1 and 3 shown in FIGS. 1 and 2, have been provided with a printed conductor pattern comprising a plurality of conductors, of which only the conductors 55 and 57 are shown. Soldered joints between non-coated free conductor portions 55a and 57a, which have been soldered to one another, are situated in a zone 60. Outside the zone 60 the conductor patterns are each situated between a base and a protective coating.

It is to be noted that the invention is not limited to the embodiments disclosed herein. For example, other types of adhesive than mentioned may be suitable for use in the method in accordance with the invention.

I claim:

1. A method of connecting two strips to each other, each strip provided with a conductor pattern, an insulating coating, which covers a part of the conductor pattern, and a set of free conductor portions of the conductor pattern, which free conductor portions are disposed outside the coating, the strips being positioned in such a manner relative to one another that the one set of free conductor portions faces the other set of free conductor portions and the coatings overlap one another at least partly, after which the two strips are pressed against one another and the one set of free conductor portions is soldered to the other set of free conductor portions, characterised in that before the strips are pressed against one another an adhesive is applied to at least one of the coatings covering a part of one of the conductor patterns, at such a location that after positioning of the strips the adhesive is situated in an overlapping area between the coatings, which adhesive is used for adhering the coatings to one another at least while the strips are pressed against one another and the one set of free conductor portions is soldered to the other set of free conductor portions.

2. A method as claimed in claim 1, characterised in that during positioning of the strips the adhesive is in a solid condition, heat being applied to the adhesive present between the coatings to soften the adhesive at least while the one set of free conductor portions is soldered to the other set of free conductor portions.

3. A method as claimed in claim 2, characterized in that after the one set of free conductor portions has been soldered to the other set of free conductor portions additional heat is supplied to the adhesive while simultaneously pressure is applied at the location of the adhesive.

4. A method as claimed in claim 1, characterised in that after the one set of free conductor portions has been soldered to the other set of free conductor portions additional heat is supplied to the adhesive while simultaneously pressure is applied at the location of the adhesive.

* * * * *